(12) United States Patent
Hikichi

(10) Patent No.: US 11,293,998 B2
(45) Date of Patent: Apr. 5, 2022

(54) MAGNETIC SENSOR CIRCUIT

(71) Applicant: ABLIC Inc., Chiba (JP)

(72) Inventor: Tomoki Hikichi, Chiba (JP)

(73) Assignee: ABLIC INC., Chiba (JP)

( * ) Notice: Subject to any disclaimer, the term of this patent is extended or adjusted under 35 U.S.C. 154(b) by 103 days.

(21) Appl. No.: 16/781,188

(22) Filed: Feb. 4, 2020

(65) Prior Publication Data

US 2020/0264241 A1 Aug. 20, 2020

(30) Foreign Application Priority Data

Feb. 15, 2019 (JP) .............................. JP2019-025535

(51) Int. Cl.
*G01R 33/00* (2006.01)

(52) U.S. Cl.
CPC ..... *G01R 33/0029* (2013.01); *G01R 33/0088* (2013.01)

(58) Field of Classification Search
CPC .............. G01R 33/00; G01R 33/0035; G01R 33/0023; G01R 33/0017; G01R 31/3191; G01R 33/0029; G01R 33/0088; G01B 7/004; G01C 17/38; G06F 3/017; G06F 3/0346; G06F 3/012

See application file for complete search history.

(56) References Cited

U.S. PATENT DOCUMENTS

| 9,664,752 B2 | 5/2017 | Monreal et al. |
| 9,733,106 B2* | 8/2017 | Judkins, III ............. G01D 5/16 |
| 2014/0347044 A1* | 11/2014 | Monreal ................. G01R 33/07 324/251 |
| 2017/0356762 A1* | 12/2017 | David ....................... G01D 5/16 |

FOREIGN PATENT DOCUMENTS

| JP | 2004153133 A | 5/2004 |
| JP | 2005283271 A | 10/2005 |

* cited by examiner

*Primary Examiner* — Patrick Assouad
*Assistant Examiner* — Taqi R Nasir
(74) *Attorney, Agent, or Firm* — Crowell & Moring LLP

(57) ABSTRACT

Provided is a magnetic sensor circuit in which increase of a delay time period is suppressed to be small without reducing a noise suppressing effect, in a case where there are multiple magnetic field detection axes. A magnetic sensor circuit is configured to subject detection signals obtained from multiple magnetic-field detection axes to time division processing, and includes a magnetic detector including at least two magnetic sensors, a switching circuit selecting a magnetic sensor represented by a selection signal to transmit the detection signal, a comparator, a control circuit, and output terminals. The control circuit supplies the selection signal to the switching circuit, and determines that the magnetic field is detected in a case where the number of times that a signal level of the signal supplied from the switching circuit exceeds a reference level reaches the number of set times that is set to a plurality of times.

8 Claims, 4 Drawing Sheets

MAGNETIC SENSOR CIRCUIT

RELATED APPLICATIONS

This application claims priority to Japanese Patent Application No. 2019-025535 filed on Feb. 15, 2019, the entire content of which is incorporated herein by reference.

BACKGROUND OF THE INVENTION

1. Field of the Invention

The present invention relates to a magnetic sensor circuit.

2. Description of the Related Art

There has been known a magnetic sensor circuit configured to detect a magnetic field. The magnetic sensor circuit has a detection axis for detecting the magnetic field, and can detect the magnetic field in a direction along the detection axis. For example, there has been proposed a magnetic sensor circuit capable of detecting magnetic fields in three directions.

The magnetic sensor circuit described in U.S. Pat. No. 9,664,752 is used for the purpose of, for example, detecting a magnetic field to be applied for tampering from the outside in order to induce malfunction of a device. The above-mentioned magnetic sensor circuit can detect a magnetic field applied for tampering even if the magnetic field is applied for tampering from any direction, as long as a magnetic flux density in any one of an x axis, a y axis, and a z axis exceeds a predetermined threshold value.

However, the magnetic sensor circuit described in U.S. Pat. No. 9,664,752 has room for further improvement in detection speed at the time of detecting the magnetic field applied for tampering. More specifically, the above-mentioned magnetic sensor circuit is driven intermittently, and hence there arises a problem in that the detection speed is lower as compared to that of a magnetic sensor circuit that is driven continuously. Further, in order to rapidly detect the magnetic field applied for tampering, it is desired that a time period required until an output logic signal is changed from the time at which the magnetic flux density exceeds the predetermined threshold value (hereinafter referred to as "delay time period") be reduced as much as possible.

Now, the delay time period of the related-art magnetic sensor circuit is described. FIG. 4 is an example of timing charts of the related-art magnetic sensor circuit. In this case, a magnetic flux density Bx, a magnetic flux density By, and a magnetic flux density Bz in FIG. 4 represent an x-axis direction component, a y-axis direction component, and a z-axis direction component, respectively, of a magnetic flux density B in an xyz three-dimensional orthogonal coordinate system. Further, in FIG. 4, there is exemplified a case in which a vector of a magnetic flux to be applied is set so that the magnetic flux density Bx and the magnetic flux density By are relatively lower than the magnetic flux density to be applied to the z axis, and the detection operation is performed in the z axis. Further, in FIG. 4, "T" represents a signal processing time period per axis. Further, a time t0 in the horizontal axis (time axis) represents a time at which the magnetic flux density Bz exceeds a z-axis operating point Bopz, and a time t1 represents a time at which a signal representing an output state of the z axis shifts (from high to low or from low to high).

In the magnetic field detection of the magnetic sensor circuit exemplified in FIG. 4, it is determined that a magnetic field is detected at a corresponding detection axis if a pulse that appears in a waveform of a signal Sg in a case where the magnetic flux density of the detection axis exceeds the z-axis operating point Bopz is detected successively a plurality of times, for example, four times. The change of the magnetic flux density at the outside is asynchronous with the signal processing operation performed inside of the magnetic sensor circuit, and the output logic signal changes with a delay corresponding to the delay time period from the change of the magnetic flux density at the outside. Therefore, as shown in FIG. 4, in a case where the selection among the x axis, the y axis, and the z axis is sequentially repeated, and four successive matching determinations are required for the detection of the magnetic field, the maximum time period (hereinafter referred to as "maximum output delay time period") $\tau$ required until the output logic signal is changed from the time at which the magnetic flux density Bz first exceeds the z-axis operating point Bopz, that is, the time period from the time t0 to the time t1, is 12T. This maximum output delay time period $\tau$ is remarkably increased as the number of detection axes is increased.

In contrast, if the number of times of matching determination required for the detection of the magnetic field is reduced, the increase of the maximum output delay time period can be suppressed, but reduction in number of times of matching determination leads to reduction in noise suppressing effect.

SUMMARY OF THE INVENTION

The present invention has been made in view of the above-mentioned circumstances, and has an object to provide a magnetic sensor circuit in which increase of a delay time period is suppressed to be small without reducing a noise suppressing effect, in a case where there is a plurality of detection axes (multiple axes) for detecting magnetic fields.

In order to achieve the above-mentioned object, a magnetic sensor circuit according to at least one embodiment of the present invention has at least a first detection axis capable of detecting a magnetic field in a first direction and a second detection axis capable of detecting a magnetic field in a second direction, and is configured to subject a first detection signal corresponding to the magnetic field in the first direction and a second detection signal corresponding to the magnetic field in the second direction to time division processing, the magnetic sensor circuit including a magnetic detector including at least two magnetic sensors including a first magnetic sensor configured to supply the first detection signal and a second magnetic sensor configured to supply the second detection signal; a switching circuit, which is to be connected to each of the at least two magnetic sensors of the magnetic detector, and which is configured to supply any one detection signal among detection signals received from the magnetic detector; a comparator configured to compare a signal level of the received one detection signal with a set reference level to supply a first result signal and a second result signal, the first result signal representing that the signal level of the one detection signal is equal to or lower than the set reference level, the second result signal representing that the signal level of the one detection signal is higher than the set reference level; a control circuit, which is to be connected to the comparator, and which is configured to determine whether the magnetic field is detected based on the first result signal and the second result signal to supply a signal representing a determination result; and an output terminal to be connected to the control circuit, the control circuit being configured to supply a signal corresponding to each of the at least two magnetic sensors of the magnetic detector to the switching circuit, and to determine that the magnetic field is detected in a case where a number of times that the second result signal is successively received reaches a number of set times that is set to two or more times, the switching circuit being configured to select a magnetic sensor corresponding to the signal received from the control circuit to supply corresponding one of the detection signals received from the selected magnetic sensor.

In the magnetic sensor circuit, increase of a delay time period is suppressed to be small without reducing a noise suppressing effect, in a case where there are multiple axes for detecting magnetic fields.

DETAILED DESCRIPTION OF THE PREFERRED EMBODIMENTS

Now, a magnetic sensor circuit according to at least one embodiment of the present invention is described with reference to the accompanying drawings.

Figure 1:
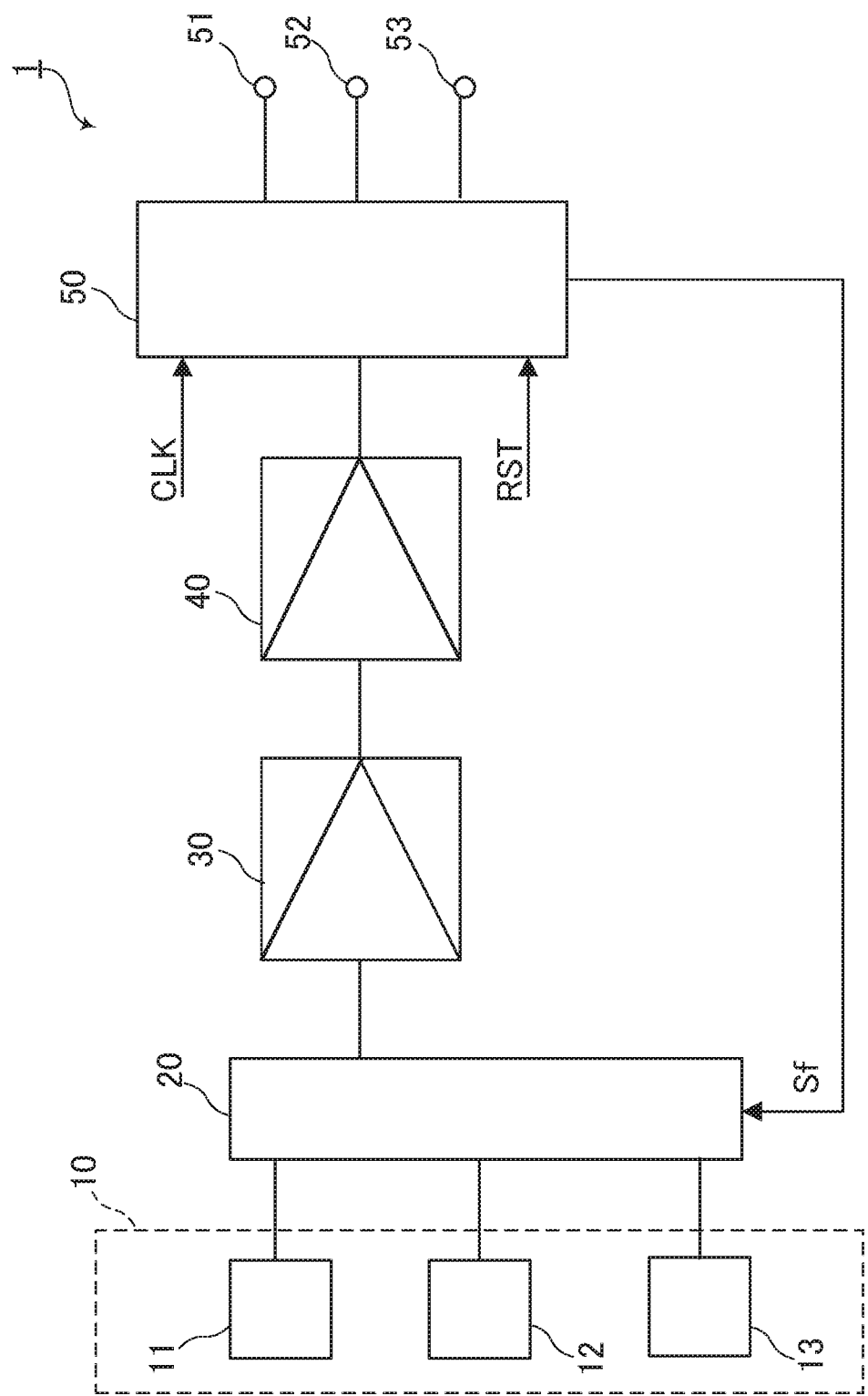
FIG. 1 is a block diagram for illustrating a magnetic sensor circuit according to an embodiment of the present invention.

FIG. 1 is a block diagram for illustrating a magnetic sensor circuit 1 as a magnetic sensor circuit according to an embodiment of the present invention.

The magnetic sensor circuit 1 is a magnetic sensor circuit, which has at least two detection axes, specifically, an x axis serving as a first detection axis capable of detecting a magnetic field in an x-axis direction being a first direction and a y axis serving as a second detection axis capable of detecting a magnetic field in a y-axis direction being a second direction, and which is configured to subject at least a first detection signal corresponding to the magnetic field in the x-axis direction and a second detection signal corresponding to the magnetic field in the y-axis direction to time division processing. The magnetic sensor circuit 1 illustrated in FIG. 1 is a magnetic sensor circuit having three detection axes as an example of the at least two detection axes. The three detection axes are an x axis, a y axis, and a z axis, which are orthogonal to each other.

The magnetic sensor circuit 1 includes, for example, a magnetic detector 10, a switching circuit 20, an amplifier 30, a comparator 40, a control circuit 50, a first output terminal 51, a second output terminal 52, and a third output terminal 53.

The magnetic detector 10 includes an x-axis magnetic sensor 11 configured to detect the magnetic field in the x-axis direction to supply the first detection signal, a y-axis magnetic sensor 12 configured to detect the magnetic field in the y-axis direction to supply the second detection signal, and a z-axis magnetic sensor 13 configured to detect a magnetic field in a z-axis direction being a third direction to supply a third detection signal. Each of the x-axis magnetic sensor 11, the y-axis magnetic sensor 12, and the z-axis magnetic sensor 13 includes an output port for supplying the detection signal that is based on the detected magnetic field. The output port of each of the x-axis magnetic sensor 11, the y-axis magnetic sensor 12, and the z-axis magnetic sensor 13 is connected to an input port of the switching circuit 20.

The switching circuit 20 includes a first input port, a second input port, and a third input port that are connected to the magnetic detector 10, more specifically, to the x-axis magnetic sensor 11, the y-axis magnetic sensor 12, and the z-axis magnetic sensor 13, respectively. The switching circuit 20 further includes a fourth input port connected to a fourth output port of the control circuit 50 to be described later. The switching circuit 20 further includes an output port for supplying one of the detection signals received from the x-axis magnetic sensor 11, the y-axis magnetic sensor 12, and the z-axis magnetic sensor 13. The output port of the switching circuit 20 is connected to an input port of the amplifier 30.

The amplifier 30 includes the input port connected to the output port of the switching circuit 20, and an output port for supplying a signal obtained by amplifying the signal received from the input port. The output port of the amplifier 30 is connected to an input port of the comparator 40.

The comparator 40 includes the input port connected to the output port of the amplifier 30, and an output port for supplying a signal representing a result of comparison between a signal level of the signal received from the input port and a set reference level. The output port of the comparator 40 is connected to an input port of the control circuit 50.

The control circuit 50 includes a first input port at which a reference clock signal CLK is received, a second input port at which a reset signal RST is received, and a third input port connected to the output port of the comparator 40. The control circuit 50 further includes a first output port, a second output port, and a third output port each used to supply a signal representing a determination result, which is obtained after determining whether or not a magnetic field is detected based on an output signal of the comparator 40. The control circuit 50 further includes the fourth output port connected to the fourth input port of the switching circuit 20. The first output port, the second output port, and the third output port are connected to the first output terminal 51, the second output terminal 52, and the third output terminal 53, respectively.

The first output terminal 51, the second output terminal 52, and the third output terminal 53 are terminals for supplying a first output signal, a second output signal, and a third output signal, respectively, to an external circuit (not illustrated). Further, the first output signal is a signal representing a result obtained by the control circuit 50 determining whether or not the x-axis magnetic sensor 11 is detecting the magnetic field. The second output signal is a signal representing a result obtained by the control circuit 50 determining whether or not the y-axis magnetic sensor 12 is detecting the magnetic field. The third output signal is a signal representing a result obtained by the control circuit 50 determining whether or not the z-axis magnetic sensor 13 is detecting the magnetic field.

Figure 2:
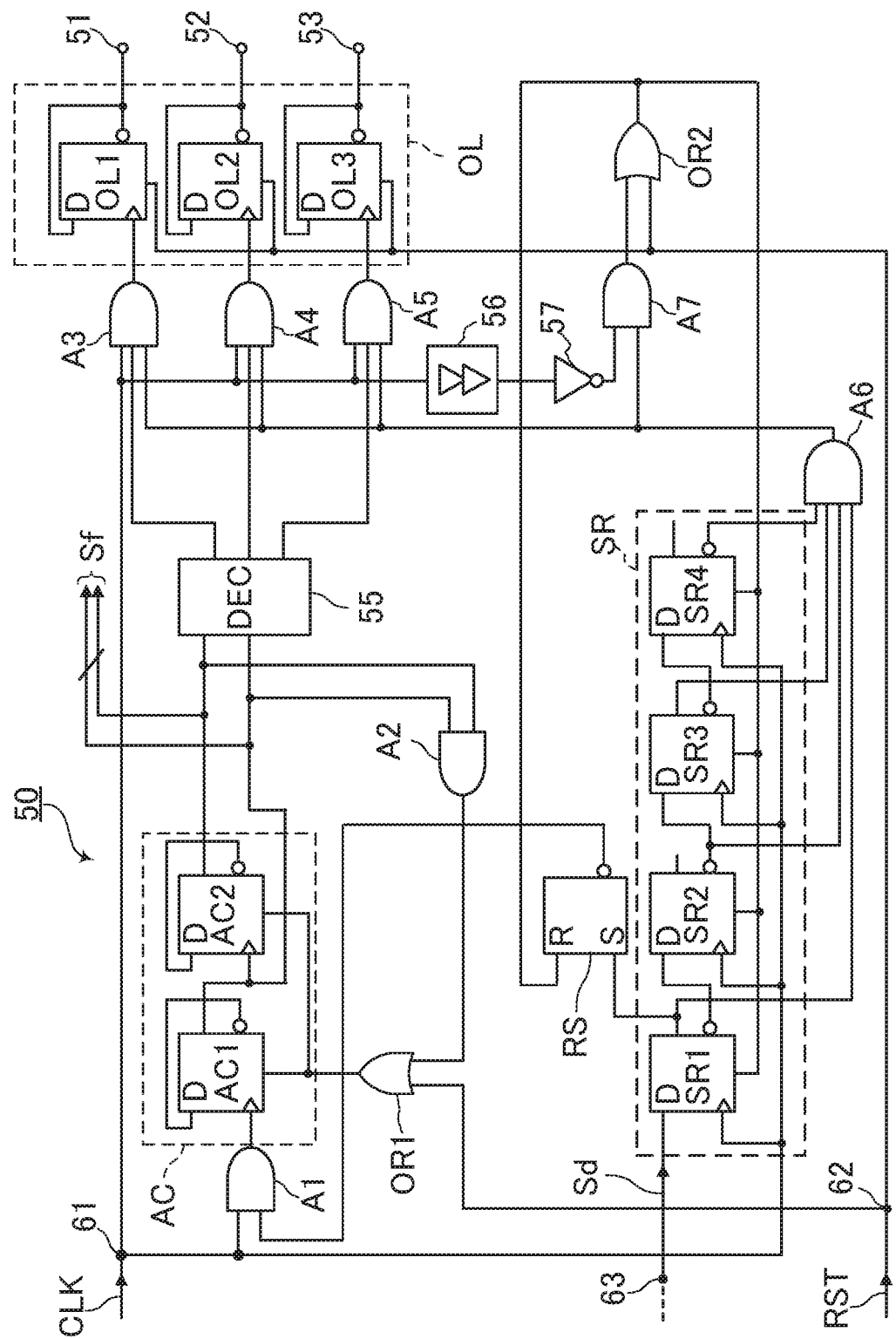
FIG. 2 is a block diagram for illustrating a configuration example of a control circuit included in the magnetic sensor circuit according to the embodiment.

FIG. 2 is a block diagram for illustrating a configuration example of the control circuit 50 in the magnetic sensor circuit 1. The control circuit 50 includes, for example, a 2-bit counter AC, a decoder 55, an output signal latch circuit OL, a delay circuit 56, an RS flip-flop circuit RS, a 4-bit shift register SR, AND gates A1 to A7, OR gates OR1 and OR2, and a NOT gate 57.

The counter AC includes two D flip-flop circuits AC1 and AC2, and is configured by connecting a Q output port of the D flip-flop circuit AC1 to a clock input port of the D flip-flop circuit AC2. The output signal latch circuit OL includes three D flip-flop circuits OL1, OL2, and OL3. The shift register SR includes four D flip-flop circuits SR1 to SR4.

A first input port 61 is connected to one of input ports of the AND gate A1, a clock input port of each of the D flip-flop circuits SR1 to SR4, one of input ports of each of the AND gates A3 to A5, and an input port of the delay circuit 56. An output port of the AND gate A1 is connected to a clock input port of the D flip-flop circuit AC1. A Q-bar output port of the D flip-flop circuit AC1 is connected to a D input port of the D flip-flop circuit AC1, and a Q-bar output port of the D flip-flop circuit AC2 is connected to a D input port of the D flip-flop circuit AC2. Further, the Q output port of the D flip-flop circuit AC1 is connected to one input port of the decoder 55, one input port of the AND gate A2, and the fourth input port of the switching circuit 20. A Q output port of the D flip-flop circuit AC2 is connected to another input port of the decoder 55, another input port of the AND gate A2, and the fourth input port of the switching circuit 20.

Three output ports of the decoder 55 are each connected to one of input ports of each of the AND gates A3 to A5. Further, an output port of the AND gate A2 is connected to one of input ports of the OR gate OR1. Further, an output port of the delay circuit 56 is connected to one of input ports of the AND gate A7 via the NOT gate 57.

A second input port 62 is connected to one of input ports of each of the OR gates OR1 and OR2, and a reset input port of each of the D flip-flop circuits OL1, OL2, and OL3. An output port of the OR gate OR1 is connected to a reset input port of each of the D flip-flop circuits AC and AC2. Further, an output port of the OR gate OR2 is connected to an R input port of an RS flip-flop circuit RS, and a reset input port of each of the D flip-flop circuits SR1 to SR4.

A third input port 63 is connected to a D input port of the D flip-flop circuit SR1. A Q output port of the D flip-flop circuit SR1 is connected to one of four input ports of the AND gate A6, and an S input port of the RS flip-flop circuit RS. A Q-bar output port of the RS flip-flop circuit RS is connected to one of input ports of the AND gate A1. Further, a Q output port of the D flip-flop circuit SR3 and Q-bar output ports of the D flip-flop circuits SR2 and SR4 are connected to the remaining three input ports of the AND gate A6. Q-bar output ports of the D flip-flop circuits SR1, SR2, and SR3 are connected to D input ports of the D flip-flop circuits SR2, SR3, and SR4 at the subsequent stage.

An output port of the AND gate A6 is connected to one of input ports of each of the AND gates A3, A4, A5, and A7. An output port of the AND gate A3 is connected to a clock input port of the D flip-flop circuit OL1. An output port of the AND gate A4 is connected to a clock input port of the D flip-flop circuit OL2. An output port of the AND gate A5 is connected to a clock input port of the D flip-flop circuit OL3.

A Q-bar output port of the D flip-flop circuit OL1 is connected to an input port of the D flip-flop circuit OL1 and the first output terminal 51. A Q-bar output port of the D flip-flop circuit OL2 is connected to a D input port of the D flip-flop circuit OL2 and the second output terminal 52. A Q-bar output port of the D flip-flop circuit OL3 is connected to a D input port of the D flip-flop circuit OL3 and the third output terminal 53. Further, an output port of the AND gate A7 is connected to one of input ports of the OR gate OR2.

Next, the action of the magnetic sensor circuit 1, that is, a magnetic detection method to be performed by the magnetic sensor circuit 1 is described.

Figure 3A:
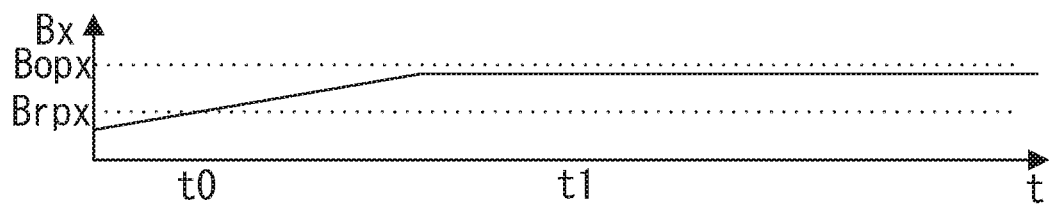
FIG. 3A is a graph for showing time shift of an x-axis direction component of a magnetic flux density.
Figure 3B:
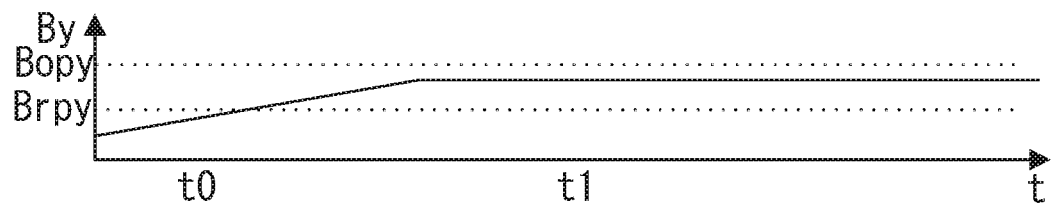
FIG. 3B is a graph for showing time shift of a y-axis direction component of the magnetic flux density.
Figure 3C:
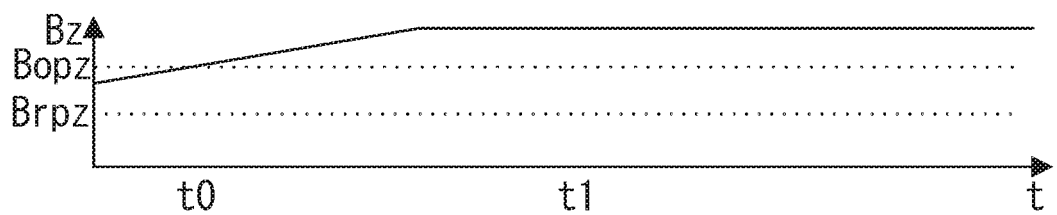
FIG. 3C is a graph for showing time shift of a z-axis direction component of the magnetic flux density.

FIGS. 3A to 3E are illustrations for illustrating an example of timing charts of the magnetic sensor circuit 1. In FIG. 3A to FIG. 3E, the horizontal axis represents a time axis t in common. Further, a magnetic flux density Bx, a magnetic flux density By, and a magnetic flux density Bz (vertical axis) in FIG. 3A to FIG. 3C represent an x-axis direction component, a y-axis direction component, and a z-axis direction component, respectively, of a magnetic flux density B in an xyz three-dimensional orthogonal coordinate system.

In FIG. 3A to FIG. 3C, there is exemplified a case in which a vector of a magnetic flux to be applied is set so that the magnetic flux density Bx and the magnetic flux density By are relatively lower than the magnetic flux density to be applied to the z axis, and the detection operation is performed in the z axis.

Figure 3D:
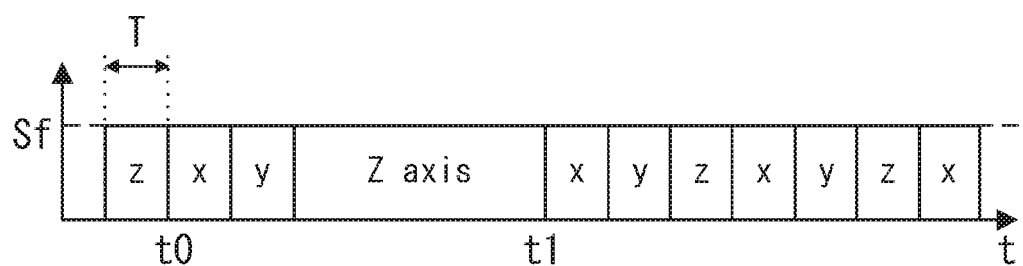
FIG. 3D is a graph for showing time shift of a sensor selection signal Sf.

In FIG. 3D, the vertical axis represents an output value (relative value) of a sensor selection signal Sf to be supplied from the control circuit 50 to the switching circuit 20. In FIG. 3D, the "x", the "y", and the "z" or "z axis" correspond to the contents of the sensor selection signal Sf, and represent the x-axis magnetic sensor 11, the y-axis magnetic sensor 12, and the z-axis magnetic sensor 13, respectively.

Figure 3E:
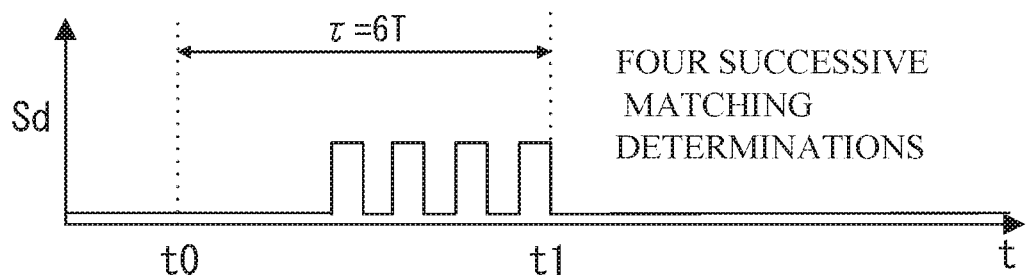
FIG. 3E is a graph for showing time shift of a comparator output signal Sd.

In FIG. 3E, the vertical axis represents an output value (relative value) of a signal (hereinafter referred to as "comparator output signal") Sd to be supplied from the comparator 40. Further, in FIGS. 3D and 3E, "T" represents a signal processing time period per axis. Further, a time t0 in the horizontal axis (time axis) shown in FIG. 3A to FIG. 3E represents a time at which the magnetic flux density Bz shown in FIG. 3C exceeds a z-axis operating point Bopz, and a time t1 represents a time at which a signal representing an output state of the z axis shifts (from high to low or from low to high).

In the magnetic sensor circuit 1, first, the x-axis magnetic sensor 11, the y-axis magnetic sensor 12, and the z-axis magnetic sensor 13 detect magnetic fields to supply detection signals that are based on the detected magnetic fields to the switching circuit 20. The switching circuit 20 selects the magnetic sensor represented by the sensor selection signal Sf, and supplies the detection signal received from the selected magnetic sensor.

The sensor selection signal Sf includes a 2-bit signal. For example, in a case where the sensor selection signal Sf includes a 2-bit signal (00b), the switching circuit 20 selects the x-axis magnetic sensor 11, and supplies the detection signal received from the x-axis magnetic sensor 11 to the amplifier 30. Further, in a case where the sensor selection signal Sf includes a 2-bit signal (01b), the switching circuit 20 selects the y-axis magnetic sensor 12, and supplies the detection signal received from the y-axis magnetic sensor 12 to the amplifier 30. Further, in a case where the sensor selection signal Sf includes a 2-bit signal (10b), the switching circuit 20 selects the z-axis magnetic sensor 13, and supplies the detection signal received from the z-axis magnetic sensor 13 to the amplifier 30.

The amplifier 30 amplifies the detection signal received from the switching circuit 20, and then supplies the amplified detection signal to the comparator 40. The comparator 40 compares a signal level of the detection signal received from the switching circuit 20 via the amplifier 30 with a set reference level, and supplies a low (L) level signal or a high (H) level signal representing a result of the comparison to the control circuit 50.

In this case, the L level signal is, for example, a signal (hereinafter referred to as "first result signal") representing such a first result that the signal level of the received detection signal is equal to or lower than the set reference level, that is, the signal level of the received detection signal does not exceed the set reference level. Further, the H level signal is a signal (hereinafter referred to as "second result signal") representing such a second result that the signal level of the received detection signal exceeds the set reference level. The H level signal is represented as a pulse in FIG. 3E.

A case in which the comparator output signal Sd is the first result signal means that the magnetic flux density detected by the selected magnetic sensor is below a release point. A case in which the comparator output signal Sd is the second result signal means that the above-mentioned magnetic flux density exceeds the operating point.

The control circuit 50 supplies the sensor selection signal Sf to the switching circuit 20 based on the comparator output signal Sd. Further, the control circuit 50 supplies the first output signal to the first output terminal 51, supplies the second output signal to the second output terminal 52, and supplies the third output signal to the third output terminal 53.

In a case where the comparator output signal Sd is the first result signal, selection of the x axis, the y axis, and the z axis is repeated in the set order. More specifically, the control circuit 50 supplies, to the switching circuit 20, the sensor selection signal Sf including the 2-bit signal (00b), (01b), or (10b) representing which detection axis among the x axis, the y axis, and the z axis is to be selected.

Further, in a case where the comparator output signal Sd is the second result signal, the control circuit 50 selects any currently-selected detection axis among the x axis, the y axis, and the z axis successively a predetermined number of set times. For example, in a case where the magnetic detection sensor supplying the detection signal is the z-axis magnetic sensor 13, the control circuit 50 supplies, to the switching circuit 20, the sensor selection signal Sf including the 2-bit signal (10b) representing that the detection axis corresponding to the z axis is selected. The above-mentioned predetermined number of set times corresponds to the number of times to perform matching determination, and is set to two or more times, for example, four times.

As shown in FIG. 3C, the magnetic flux density Bz exceeds the z-axis operating point Bopz at the time t0, but as shown in FIG. 3D, the time t0 is a time point at which the period in which the control circuit 50 is selecting the z axis is ended. Therefore, as shown in FIG. 3E, at the time t0, the comparator output signal Sd is brought to the L level. Thus, in the next z-axis selecting period, the comparator output signal Sd is shifted to be brought to the H level. That is, the control circuit 50 determines that matching is made once. After this z-axis selecting period, the detection axis corresponding to the z axis is further successively selected three times. At the time t1, the matching determination is successively made four times, and hence the control circuit 50 supplies, to the third output terminal 53, an output signal (for example, L level) representing that the z-axis magnetic sensor 13 is detecting a magnetic field in the z-axis direction.

Figure 4:
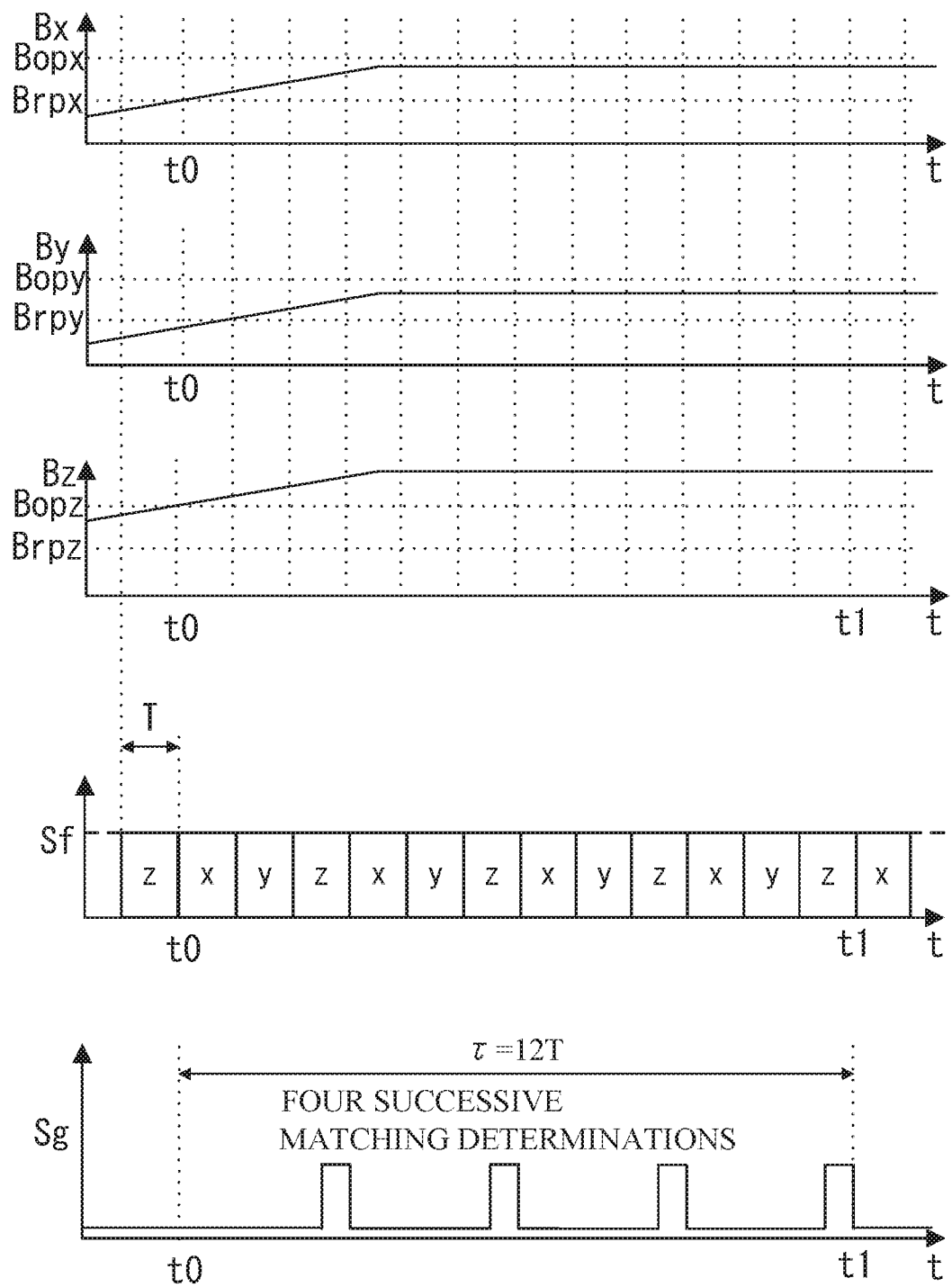
FIG. 4 is an example of timing charts of the related-art magnetic sensor circuit.

According to the magnetic sensor circuit 1 and the magnetic detection method therefor, in a case where the magnetic flux density Bz exceeds the z-axis operating point Bopz, the z axis is repeatedly selected a predetermined number of times so that matching determination is made a predetermined number of times. With the above-mentioned operation, in a case where there are three detection axes and the matching determination is made four times, a time period (maximum output delay time period) from the time t0 to the time t1 can be suppressed to 6T. This is half of the maximum output delay time period 12T required in a case of applying a magnetic sensor circuit, which is configured to sequentially select the x axis, the y axis, and the z axis in FIG. 4, and a magnetic detection method therefor.

As described above, according to this embodiment, even if the matching determination is made a plurality of times, the increase of the delay time period can be suppressed to be small without reducing the noise suppressing effect. That is, according to the magnetic sensor circuit 1 and the magnetic detection method therefor, it is possible to provide a multi-axis magnetic sensor circuit, which has sufficient repeatability and reproducibility of the operating point and the release point without significantly decreasing the responsiveness, and to provide a magnetic detection method therefor.

It is noted that the present invention is not limited to the above-described at least one embodiment as they are and, in an implementation phase, can be embodied in various forms other than the specific embodiments described above. Various omissions, additions, substitutions, and changes may be made without departing from the spirit and scope of the invention. The at least one embodiment and modifications thereof are included within the sprit and scope of the invention and are included within the scope of the invention as disclosed in the claims and equivalents thereof.

For example, the above-mentioned magnetic sensor circuit 1 is an example having three detection axes, but the number of detection axes is not necessarily limited to three. The present invention is applicable to a magnetic sensor circuit having at least two detection axes. That is, the present invention is applicable to a two-axis magnetic sensor circuit such as a two-axis switch or a two-axis latch. Further, the configuration of the control circuit 50 is not limited to that exemplified in FIG. 2, and other configurations may be employed as long as the configurations are functionally equivalent.

Further, components may be added to the magnetic sensor circuit 1 as required. For example, in consideration of a case in which an S/N ratio of the amplified detection signal is low, a filter circuit may be added between the amplifier 30 and the comparator 40. Further, the magnetic sensor circuit 1 illustrated in FIG. 1 is an example in which the same number of output terminals 51, 52, and 53 as the number of detection axes are provided, but the configuration of the output terminals is not necessarily limited thereto. In a case where the control circuit 50 is configured so that the control circuit 50 adds information that enables any of the x axis, the y axis, and the z axis to be identified to a signal to be supplied to the outside, the number of output terminals may be one.

Further, in a case where sensor elements having large offset voltages, for example, Hall elements are used for the x-axis magnetic sensor 11, the y-axis magnetic sensor 12, and the z-axis magnetic sensor 13, further components may be added to the magnetic sensor circuit 1 so that a spinning current method can be applied. For example, a switch network is provided between the switching circuit 20 and each of the x-axis magnetic sensor 11, the y-axis magnetic sensor 12, and the z-axis magnetic sensor 13, or between the switching circuit 20 and the amplifier 30. Further, a sample and hold circuit is provided between the amplifier 30 and the comparator 40. Further, timings such as φ1 and φ2 are set during the processing period T of each of the detection axes corresponding to the x axis, the y axis, and the z axis.

According to the magnetic sensor circuit having a configuration that enables the spinning current method to be applied as described above and to a magnetic detection method therefor, the offset voltage can be canceled even if a sensor element having a large offset voltage is used.

The magnetic sensor circuit 1 illustrated in FIG. 1 is an example including the amplifier 30, but in a case where the detection signals of the magnetic sensors 11, 12, and 13 to be supplied from the switching circuit 20 have sufficiently high S/N ratios, the amplifier 30 may be omitted. Further, the magnetic sensor circuit 1 may be configured as a semiconductor device. That is, the magnetic sensor circuit 1 may be formed on a semiconductor substrate. The semiconductor device may include a part of components of the magnetic sensor circuit 1. The semiconductor device composed of the control circuit 50 may be configured as a magnetic detection controller.

What is claimed is:

1. A magnetic sensor circuit, which has at least a first detection axis capable of detecting a magnetic field in a first direction and a second detection axis capable of detecting a magnetic field in a second direction, and which is configured to subject a first detection signal corresponding to the magnetic field in the first direction and a second detection signal corresponding to the magnetic field in the second direction to time division processing, the magnetic sensor circuit comprising:
a magnetic detector including at least two magnetic sensors including a first magnetic sensor configured to supply the first detection signal and a second magnetic sensor configured to supply the second detection signal;
a switching circuit, which is to be connected to each of the at least two magnetic sensors of the magnetic detector, and which is configured to supply any one detection signal among detection signals received from the magnetic detector;
a comparator configured to compare a signal level of the received one detection signal with a set reference level to supply a first result signal and a second result signal, the first result signal representing that the signal level of the one detection signal is equal to or lower than the set reference level, the second result signal representing that the signal level of the one detection signal is higher than the set reference level; and
a control circuit, which includes an input port connected to the comparator and a control signal output port connected to the switching circuit, and which is configured to determine whether the magnetic field is detected based on the first result signal, the second result signal, and a number of times that the second result signal is successively received, and to supply a control signal corresponding to each of the at least two magnetic sensors of the magnetic detector to the switching circuit based on a determination whether the magnetic field is detected,
the switching circuit being configured to select a magnetic sensor corresponding to the control signal received from the control circuit to supply corresponding one of the detection signals received from the selected magnetic sensor, the switching circuit including a control signal input port connected to the control signal output port in the control circuit.

2. The magnetic sensor circuit according to claim 1, further comprising an amplifier configured to amplify the one detection signal,
wherein the amplifier is to be connected between the switching circuit and the comparator.

3. The magnetic sensor circuit according to claim 1, wherein the control circuit includes an output circuit which is configured to generate an output signal corresponding to each of the at least two magnetic sensors of the magnetic detector in a case where the control circuit determines that the magnetic field is detected.

4. The magnetic sensor circuit according to claim 3, further comprising output terminals,
wherein the output circuit includes output ports which are to be connected to each of the output terminals, and of which a number is a same number as a number of the at least two magnetic sensors.

5. The magnetic sensor circuit according to claim 1, wherein the control circuit includes a counter which is configured to count the number of times that the second result signal is successively received, a determination circuit which is configured to determine whether or not the number of times that the second result signal is successively received reaches a number of set times that is set to two or more times based on a number counted by the counter, and a control signal generation circuit which is configured to generate the control signal based on a result determined by the determination circuit.

6. The magnetic sensor circuit according to claim 5, wherein the control signal generation circuit has a first generation pattern of the control signal and a second generation pattern of the control signal, and is configured to perform the first generation pattern to generate the control signal if the determination circuit determines that the number of times that the second result signal is successively received reaches the number of set times that is set to two or more times or the number of times that the second result signal is successively received is zero, and to perform the second generation pattern to generate the control signal if the determination circuit determines that the number of times that the second result signal is successively received is larger than zero but less than the number of set times that is set to two or more times.

7. The magnetic sensor circuit according to claim 6, wherein the control signal generated by currently performing the second generation pattern corresponds to any one magnetic sensor of the at least two magnetic sensors, the any one magnetic sensor being a same one magnetic sensor as corresponding one magnetic sensor of the control signal generated by previously performing the second generation pattern.

8. The magnetic sensor circuit according to claim 1, the magnetic sensor circuit being configured to subject a third detection signal in addition to the first and second detection signal to time division processing,
wherein the magnetic detector includes a third magnetic sensor configured to supply the third detection signal corresponding to a magnetic field in a third direction being perpendicular to the first direction and the second direction, and
wherein the switching circuit includes a first input port to be connected to the first magnetic sensor, a second input port to be connected to the second magnetic sensor, a third input port to be connected to the third magnetic sensor, the control signal input port, and an output port configured to selectively connect to any one input port of the first to third input ports.

* * * * *